(12) United States Patent
Hsieh

(10) Patent No.: US 11,423,830 B2
(45) Date of Patent: Aug. 23, 2022

(54) DISPLAY APPARATUS WITH ARRAY OF LIGHT EMITTING DIODES AND METHOD OF MANUFACTURING THE SAME

(71) Applicant: EPISTAR CORPORATION, Hsinchu (TW)

(72) Inventor: Min-Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 17/233,777

(22) Filed: Apr. 19, 2021

(65) Prior Publication Data

US 2021/0241683 A1 Aug. 5, 2021

Related U.S. Application Data

(63) Continuation of application No. 16/447,484, filed on Jun. 20, 2019, now Pat. No. 10,984,702.

(30) Foreign Application Priority Data

Jun. 22, 2018 (TW) .................................. 107121480
Jun. 10, 2019 (TW) .................................. 108119854

(51) Int. Cl.
*H01L 21/00* (2006.01)
*G09G 3/32* (2016.01)
*H01L 21/02* (2006.01)
*H01L 33/38* (2010.01)

(52) U.S. Cl.
CPC ......... *G09G 3/32* (2013.01); *H01L 21/02263* (2013.01); *H01L 33/38* (2013.01)

(58) Field of Classification Search
CPC ...... G09G 3/32; H01L 21/02263; H01L 33/38
See application file for complete search history.

(56) References Cited

U.S. PATENT DOCUMENTS 9,349,712 B2    5/2016  Yu et al.
9,472,714 B2   10/2016  Hsia et al.
10,984,702 B2*  4/2021  Hsieh ..................... G09G 3/32

* cited by examiner

*Primary Examiner* — Richard A Booth
(74) *Attorney, Agent, or Firm* — Patterson + Sheridan, LLP

(57) ABSTRACT

A display includes a substrate with a plurality of electronic control elements, an array of light-emitting diodes having a semiconductor layer, a plurality of light emitting units disposed on the semiconductor layer, and a plurality of first electrodes disposed on the semiconductor layer, an bonding layer disposed between the substrate and the array of light-emitting diodes, and a plurality of wavelength conversion elements disposed on the semiconductor layer and spaced apart from each other. The plurality of wavelength conversion elements and the plurality of light emitting units are disposed at different sides of the semiconductor layer. The plurality of wavelength conversion elements is arranged in positions corresponding to the plurality of light-emitting units.

17 Claims, 16 Drawing Sheets

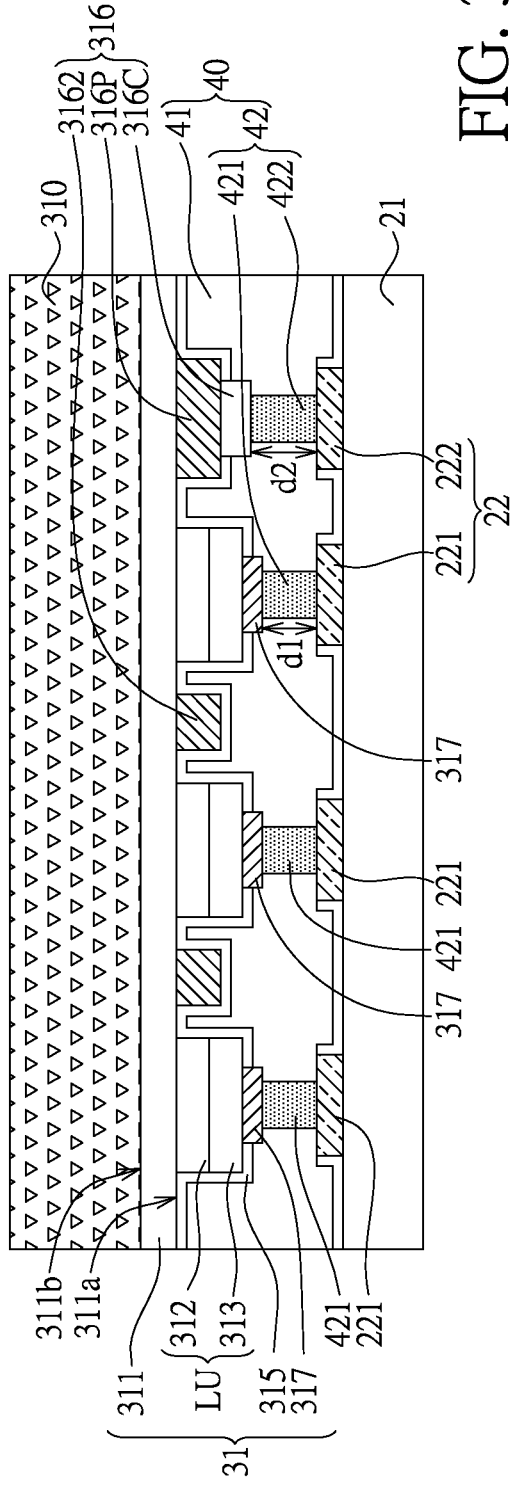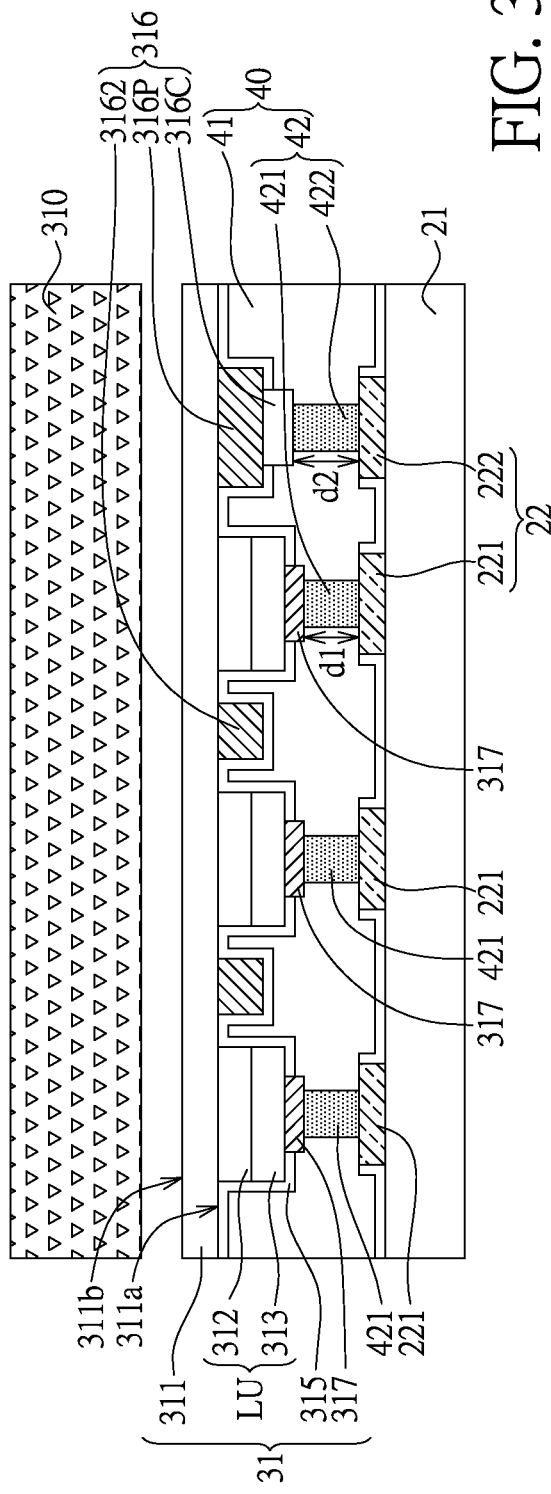

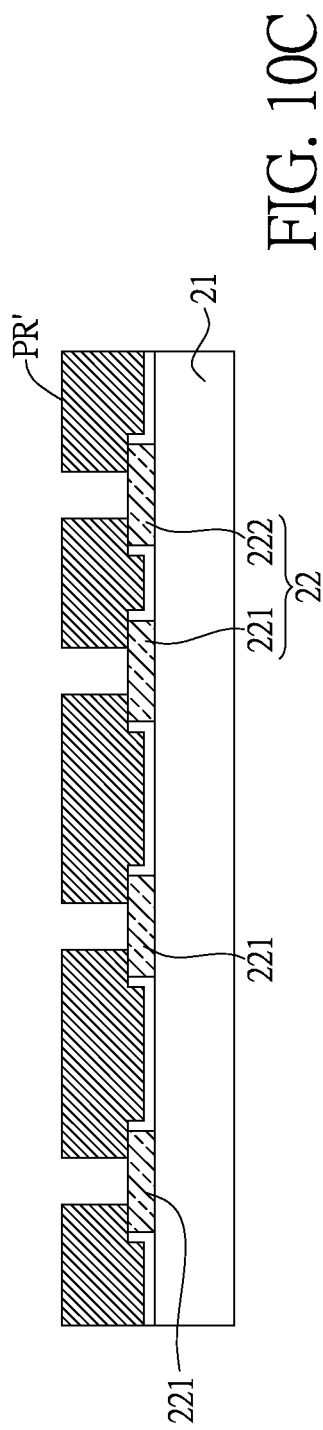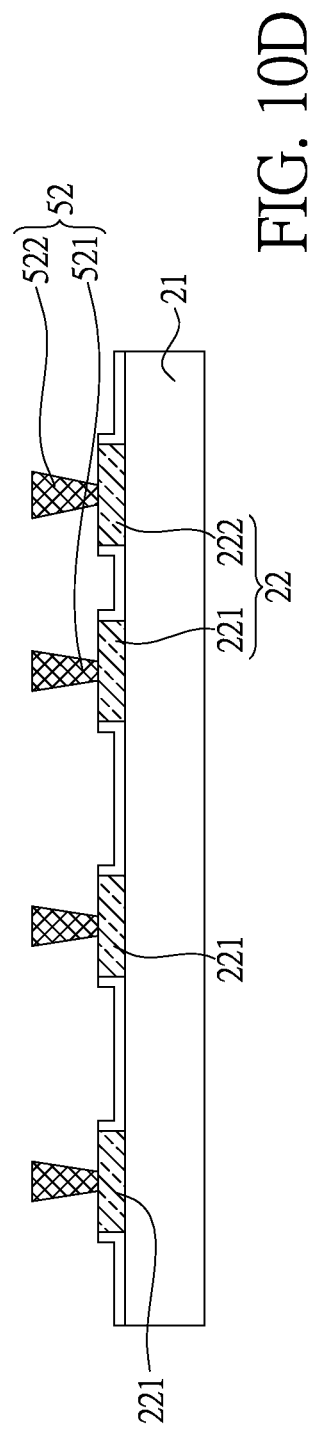

DISPLAY APPARATUS WITH ARRAY OF LIGHT EMITTING DIODES AND METHOD OF MANUFACTURING THE SAME

RELATED APPLICATION DATA

This application is a continuation of U.S. application Ser. No. 16/447,484 filed Jun. 20, 2019, which claims the right of priority of TW Application No. 108119854, filed on Jun. 10, 2019, which claimed the right of priority of TW Application No. 107121480, filed on Jun. 22, 2018, the contents of which are hereby incorporated by reference in their entireties.

TECHNICAL FIELD

The application is related to a manufacturing method of a display, and especially related to a manufacturing method of a display with an array of light-emitting diodes.

DESCRIPTION OF BACKGROUND ART

As light-emitting diode (LED) industry progresses and advances, the full color display, which uses light-emitting diodes for self-illuminating pixels or miniaturized LED display, is booming and a feasible next generation display technology. The display with the self-illuminating pixels or miniaturized LED, which includes flexible and transparent display, is more popular than TFT-LCD. However, there are cost and technology bottlenecks for commercialization to overcome. For example, an active light-emitting diode array display can use bumps formed on electrodes to electrically connect a driver carrier and a light-emitting diode array. This connecting method is difficult to be implemented, and the alignment between the bumps and the electrodes of light-emitting diodes is not easy as well. Furthermore, there is no underfill between and supporting the driver carrier and the light-emitting diode array so the growth substrate for forming the light-emitting diode array cannot be removed. Therefore, the existence of the growth substrate affects the light between the neighboring pixels and causes cross-talk influencing the image quality.

SUMMARY OF THE DISCLOSURE

The application is related to a display apparatus with an array of light emitting diodes and a method of manufacturing the same. In embodiment, a bonding layer is formed between a driver substrate and an array of light emitting diodes, and the growth substrate for forming the array of light emitting diodes can be removed after forming the bonding layer. The crosstalk between the pixels is therefore eliminated.

One embodiment discloses a display including a substrate including a plurality of control elements, an array of light emitting diodes which includes a semiconductor layer, a plurality of light-emitting units formed on the semiconductor layer and a plurality of first electrodes formed on the semiconductor layer, a bonding layer formed between the substrate and the array of light emitting diodes, and a plurality of wavelength conversion elements. The wavelength conversion elements and the light-emitting units are disposed at different sides of the semiconductor layer. The plurality of wavelength conversion elements is arranged in positions corresponding to the plurality of light-emitting units. The plurality of wavelength conversion elements is spaced apart from each other.

One embodiment discloses a display including a substrate with a plurality of electronic control elements, an array of light emitting diodes including a semiconductor layer, a plurality of light-emitting units formed on the semiconductor layer, and a plurality of first electrodes formed on the semiconductor layer, and a bonding layer including a bonding glue and a plurality of connecting metals in the bonding glue. The bonding glue is arranged between the substrate and the array of light emitting diodes. The plurality of connecting metals includes a plurality of first portions which corresponds to the plurality of light-emitting units, and a plurality of second portions which corresponds to a portion of the plurality of first electrodes. The plurality of first portions and the plurality of second portions have different heights.

One embodiment discloses a method of manufacturing a display. The method includes steps of providing a substrate, forming a plurality of connecting metals on the substrate, providing an array of light emitting diodes, connecting the array of light emitting diodes and the substrate, forming a bonding glue between the substrate and the array of light emitting diodes, and forming a plurality of wavelength conversion elements on the semiconductor layer. The substrate includes a plurality of electronic control elements. The plurality of connecting metals includes a plurality of first portions and a plurality of second portions. The array of light emitting diodes includes a semiconductor layer and a plurality of light-emitting units formed on the semiconductor layer. The wavelength conversion elements and the light-emitting units are disposed at different sides of the semiconductor layer. The plurality of wavelength conversion elements is arranged in positions corresponding to the plurality of light-emitting units. The plurality of wavelength conversion elements is arranged to space apart from each other. The step of forming the bonding glue can be performed before or after the step of connecting the array of light emitting diodes and the substrate.

For better understanding the above and other aspects of the present application, the following specific embodiments are described in detail below with reference to the accompanying drawings.

BRIEF DESCRIPTION OF THE DRAWINGS

FIGS. 3A-3E show a method of manufacturing a display in accordance with one embodiment of present application;

FIGS. 10A-10F show one method of manufacturing the display as shown in FIG. 9;

DETAILED DESCRIPTION OF PREFERRED EMBODIMENTS

Figure 6:
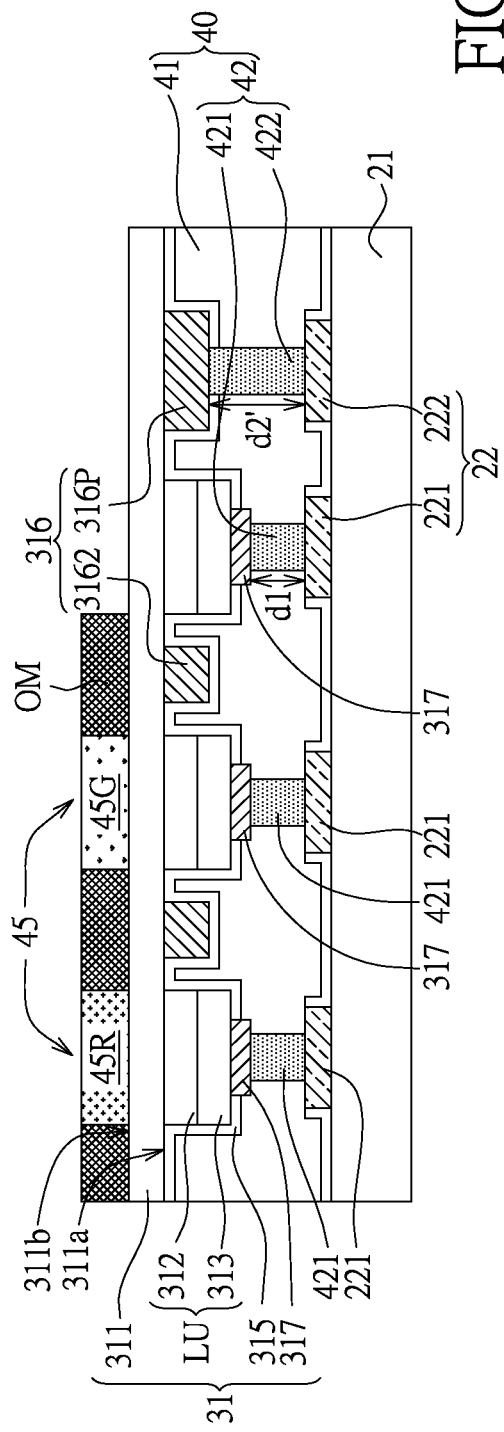
FIG. 6 shows a schematic cross-sectional view of a display in accordance with one embodiment of present application.

In the following embodiments of the application, a display with a light emitting diode array (LED array) and a method of manufacturing the same are provided, wherein a bonding layer is formed between a driver carrier (e.g., a CMOS substrate) and the LED array. The bonding layer includes a bonding metal and a bonding glue, wherein the bonding metal can provide electrical connection between the driver carrier and the LED array, and the bonding glue fills a gap between the driver carrier and the LED array and provides support. Therefore, during the process of manufacturing the display in accordance with one embodiment of present application, the growth substrate (for example, the sapphire substrate), which is used to form the LED array, can be removed after the bonding layer is disposed. And then, according to application requirements, a wavelength conversion layer (for example, a wavelength conversion element including quantum dot fluorescent powder) can be formed on the surfaces of the LED array to emit red light, green light and blue light to form the full color. Therefore, compared with the conventional structure, the display disclosed in the embodiment has a bonding glue for supporting the driver carrier and the LED array and improving the reliability of the driver carrier and the LED array. Since the growth substrate is removed, the overall thickness of the display is reduced, and the flexibility of the display can be increased so the display can be adapted to various applications. If the wavelength conversion layer is applied to miniaturized light-emitting diode array, the display without the growth substrate as shown in FIG. 6 can be free from mutual interference of optical signals between sub-pixels (also known as cross-talk). Furthermore, the method of manufacturing a display disclosed in the following embodiments includes inter-filling and electrical connecting between a light-emitting diode having the same or different electrode horizontal levels (in particular, the n-electrode and the p-electrode are in different horizontal levels) and the driver carrier. Therefore, the formation of the bonding metal and the bonding glue in the bonding layer does not cause damage to the driver carrier and the LED array, and the manufacturing process of the display with the LED array is not necessarily time-consuming and expensive. In that case, the structure and the manufacturing method mentioned in the embodiment are suitable for mass production.

The displays disclosed in the embodiments are widely used. The following embodiments are exemplified by a display having a miniaturized-LED array, but the disclosure is not limited to the aspect. The following embodiments are described in conjunction with the drawings to explain in detail the related structures of the display and the manufacturing method thereof. In the embodiments, the same or similar reference numerals are used to designate the same or similar parts for clarity of explanation. However, the description of the embodiments, such as the detailed structure, the process steps, the material application, and the like, are only for illustrative purposes, and the scope of the disclosure is not limited to the described aspects. The disclosure does not show all possible embodiments, and the structure and process disclosed in the embodiments may be modified to meet the needs of practical applications without departing from the spirit and scope of the disclosure. Therefore, other implementations not presented in the present application may also be applicable. In addition, the drawings have been simplified to clearly illustrate the contents of the application, and the dimensional ratios in the drawings are not drawn in proportion to actual products. Therefore, the description and drawings are for illustrative purposes only and are not intended to be limited.

Furthermore, the terms used in the specification and the claims, such as "first", "second", etc., are used to modify the elements of the claim, which are not intended to be the previous ordinal of the element, does not represent the order of one element and another request element, or the order of the manufacturing method. The use of these ordinals is only used to distinguish two elements with a certain names. In addition, when a first material layer is described to be above, upon or on a second material layer, unless otherwise defined, the first material layer may be directly in contact with the second material layer. Alternatively, it is also possible to have one or more layers of other materials interposed, in which case there may be no direct contact between the first material layer and the second material layer.

Figure 1:
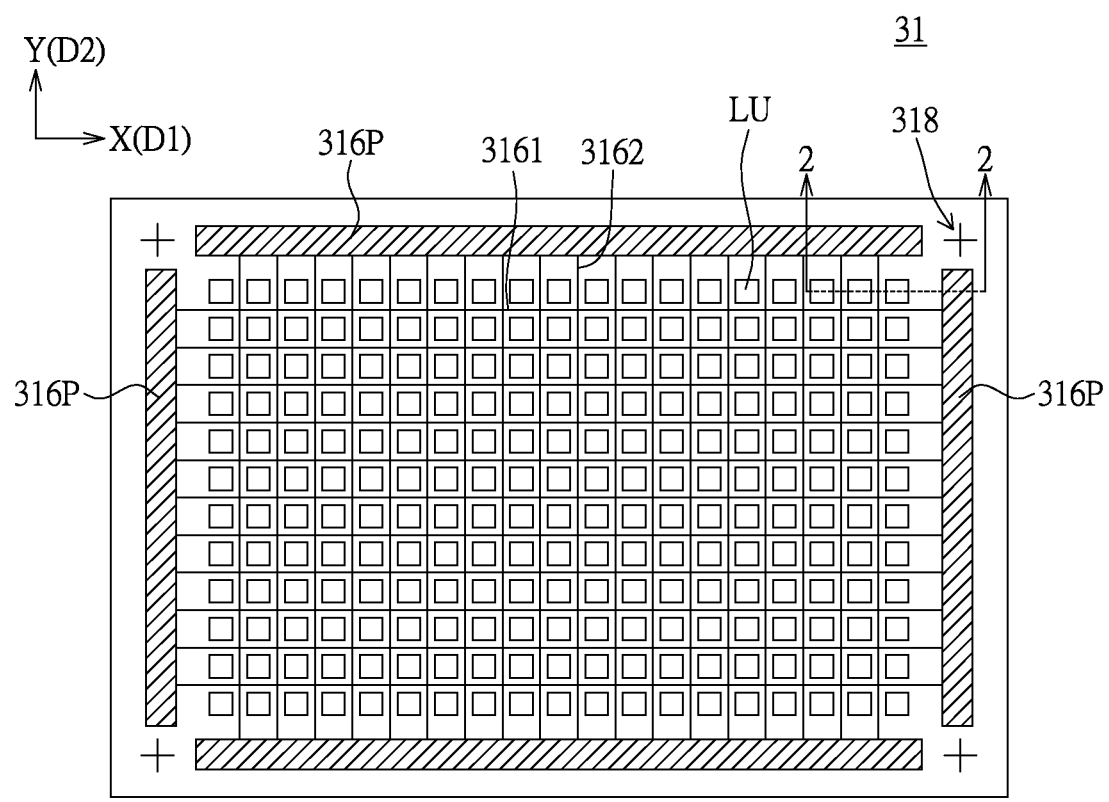
FIG. 1 shows an array of light-emitting diodes (LED array) and electrodes in accordance with one embodiment of present application.
Figure 2:
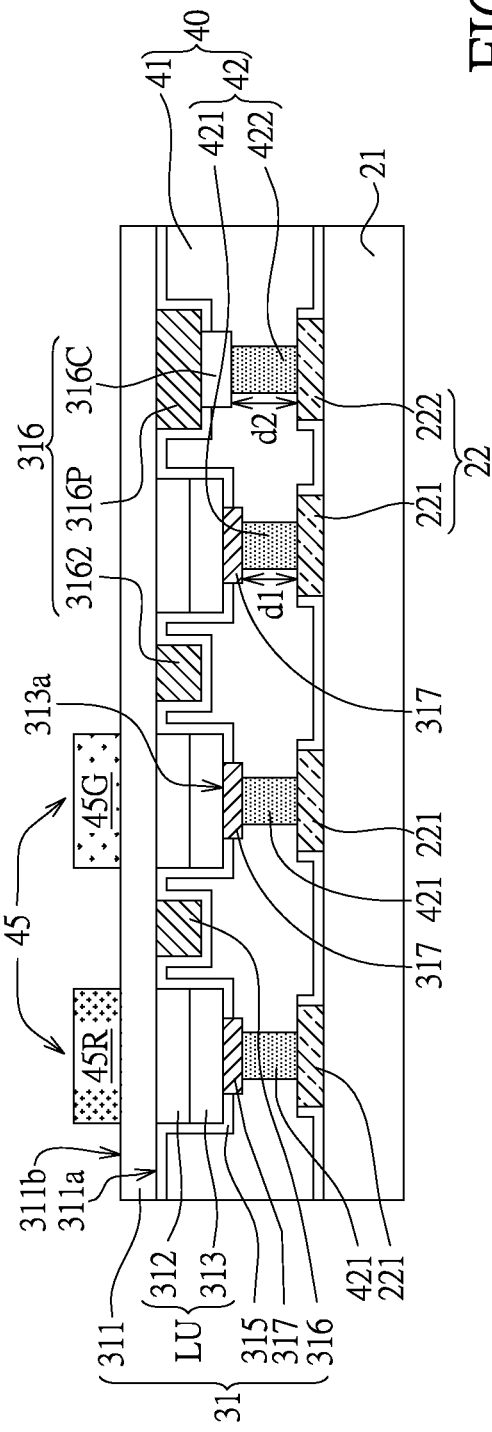
FIG. 2 shows a cross-sectional diagram of a display in accordance with one embodiment of present application, wherein the LED array and the electrodes are depicted along sectional line 2-2 of FIG. 1.

FIG. 1 shows a top view of an LED array 31 bonded with a driver carrier 21 in accordance with one embodiment of present application. FIG. 2 shows a cross-sectional diagram of the LED array 31 bonded with the driver carrier 21 along sectional line 2-2 of FIG. 1. In this embodiment, the structure of the LED array 31, which can be a miniaturized-LED array, bonded with the driver carrier 21 can be applied for forming a display. As shown in FIG. 2, the LED array 31 includes a first semiconductor layer 311, a plurality of light-emitting units (LU) formed on the first semiconductor layer 311, a plurality of first electrodes 316, such as n-electrodes, formed on the first semiconductor layer 311, and a plurality of second electrodes 317, such as p-electrodes, form on the plurality of light-emitting units (LU). The first semiconductor layer 311 is a first conductive type semiconductor layer, and each of the light emitting units (LU) includes an active layer 312 (e.g., Multiple Quantum Well, MQW) and a second semiconductor layer 313 formed on the active layer 312, wherein the second semiconductor layer 313 is a second conductive type semiconductor layer, and the second electrodes 317 are respectively formed on the second semiconductor layer 313 of each of the light-emitting units (LU). In one embodiment, the first conductive type and the second conductive type are respectively n-type and p-type. In the embodiment, the first semiconductor layer 311 and the second semiconductor layer 313 can be a cladding layer or a confinement layer, which are formed by epitaxial growth on a growth substrate, such as sapphire or GaAs substrate, and able to respectively provide electrons and holes for being combined in the active layer 312 to emit light. The first semiconductor layer 311, the active layer 312, and the second semiconductor layer 313 may include III-V semiconductor material, such as $Al_xIn_yGa_{(1-x-y)}N$ or $Al_xIn_yGa_{(1-x-y)}P$, where $0 \le x$, $y \le 1$; $(x+y) \le 1$. Based on the material of the active layer 312, the light-emitting unit (LU) is able to emit a red light with a peak wavelength between 580 nm and 700 nm, a green light with a peak wavelength between 530 nm and 570 nm, and a blue light with peak wavelength between 450 nm and 490 nm, or a UV light with peak wavelength between 380 nm and 420 nm, such as 400 nm. In one example, the first semiconductor layer 311 is n-GaN, the active layer 312 is a multiple quantum well (MQW), and the second semiconductor layer 313 is p-GaN, and each of the light emitting units LU emits blue light with a peak wavelength between 450 nm and 490 nm. In another embodiment, the LED array 31 further includes an insulating layer 315 covering the first semiconductor layer 311 and the light emitting unit LU, and the insulating layer 315 exposes a portion of the surface 313a of the second semiconductor layer 313 of each of the light emitting units LU. Each of the second electrodes 317 is formed on the surface 313a and contacts the second semiconductor layer 313, wherein the first portions 421 of the connecting metals 42 of the bonding layer 40 is respectively connected to the second electrode 317 on each of the light emitting units (LU), as shown in FIG. 2.

As shown in FIG. 1, the plurality of light-emitting units LU and the plurality of first electrodes 316 being made by a metal grid are exemplified. For example, the plurality of first electrodes 316, which can be n-electrodes, includes a plurality of conductive pads 316P located on the periphery of the LED array 31 (e.g., four conductive pads 316P shown in FIG. 1) and a plurality of extensions between adjacent light-emitting units LU, including a plurality of first metal traces 3161 extending along a first direction D1 (e.g., X direction) and a plurality of second metal traces 3162 extending along the second direction D2 (e.g., Y direction), and the plurality of first metal traces 3161 and the plurality of second metal traces 3162 are electrically connected to the corresponding conductive pads 316P. The first and second metal traces 3161, 3162 can reduce the value of the series resistance and make the series resistance of each pixel current path nearly uniform. In other embodiment, the plurality of first electrodes 316 can be p-electrode.

As FIG. 2 shows, in accordance with one embodiment of present application, the LED array 31 is bonded to the driver carrier 21 having a plurality of electronic control elements. The driver carrier 21 such as a CMOS backplane or any substrate having a control circuit thereon can electrically connect to the LED array 31 for controlling the electric current driving each pixel. The display disclosed in the embodiment further includes a bonding layer 40 formed between the driver carrier 21 and the LED array 31. As shown in FIG. 2, the bonding layer 40 includes a bonding glue 41 (e.g., non-conductive glue) and a plurality of connecting metals 42 in the bonding glue 41. The bonding glue 41 fills a gap between the driver carrier 21 and the LED array 31. After the driver carrier 21 and the LED array 31 are joined, the bonding glue 41 can support the driver carrier 21 and the LED array 31 and appropriately block the moisture from eroding the first and second electrodes 316, 317 and from entering the structure of the LED array 31.

As shown in FIG. 2, the connecting metal 42 includes a plurality of first portions 421 corresponding to the light-emitting units (LU), and a plurality of second portions 422 corresponding to the conductive pads 316P of the first electrodes 316 located at the periphery of the LED array 31. That is, the second portion 422 of the connecting metal 42 corresponds to the conductive pads 316P. The height d1 of the first portion 421 is different from the height d2 of the second portion 422.

Furthermore, in the embodiment, the display further includes a plurality of second electrodes 317, such as p-electrodes, respectively formed on each of the light-emitting units (LU), wherein the first portions 421 of the connecting metals 42 are connected to the second electrodes 317. In the embodiment which shows the miniaturized-LED array, the second electrodes 317 (for example, p-electrodes) are formed on each of the plurality of light-emitting units (LU), and the first electrode 316 (for example, n-electrode) is shared by the plurality of light-emitting units (LU). The material of the first electrodes 316 and the second electrodes 317 may be made of transparent conductive material or metal material. The transparent conductive material includes indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), aluminum gallium arsenide (AlGaAs), gallium nitride (GaN), gallium phosphide (GaP), gallium arsenide (GaAs), gallium arsenide phosphide (GaAsP), indium zinc oxide (IZO), and diamond-like carbon (DLC). The metal material includes aluminum (Al), chromium (Cr), copper (Cu), tin (Sn), gold (Au), nickel (Ni), titanium (Ti), platinum (Pt), lead (Pb), Zinc (Zn), cadmium (Cd), antimony (Sb), cobalt (Co), and alloys containing the above.

In the embodiment, the driver carrier 21 (with control circuit) has a plurality of pads 22 thereon. The other end of the connecting metal 42 of the bonding layer 40 is connected to the pad 22 on the driver carrier 21. As shown in FIG. 2, the pads of the driver carrier 21 may include a plurality of first control pads 221 and a plurality of second control pads 222, wherein the first portions 421 of the connecting metals 42 electrically connect the first control pads 221 and the second electrodes 317, and the second portions 422 of the connecting metals 42 electrically connect the second control pads 222 and the conductive pads 316P of the first electrode 316 located on the periphery of the LED array 31. In this embodiment, there is a connecting portion 316C on the conductive pad 316P so that the second portion 422 of the connecting metal 42 can be electrically connected with the conductive pad 316P through the connecting portion 316C. Furthermore, in this embodiment, the thickness of the connecting portion 316C may be equal to or not equal to the thickness of the second electrode 317. For example, as shown in FIG. 2, the thickness of the connecting portion 316C can be slightly larger than the thickness of the second electrode 317.

In addition, in the embodiment, the horizontal level of the first electrode 316 is different from the horizontal level of the second electrode 317. For example, the conductive pad 316P of the first electrode is closer to the first semiconductor layer 311 than the second electrode 317 is. And, the connecting portion 316C on the conductive pad 316P is also closer to the first semiconductor layer 311 than the second electrode 317 is. Therefore, as shown in FIG. 2, in the bonding layer 40, the height d1 of the first portion 421 of the connecting metal 42 is smaller than the height d2 of the second portion 422. Still, the arrangement of the first electrode 316 and the second electrode 317 of the LED array 31 is not limited to the structure shown in FIG. 2. In practical application, the height d1 of the first portion 421 of the connecting metal 42 and the height d2 of the second portion 422 are subject to the arrangement of the first electrode 316 and the second electrode 317. And, in the embodiment, the heights d1, d2 can be different or the same. In addition, in other embodiments, the conductive pad 316P may not have the connecting portion 316C disposed thereon.

In accordance with the embodiment of the present application, in addition to the connecting metal 42 in the bonding layer 40 being able to provide electrical connection between the driver carrier 21 and the LED array 31, the bonding glue 41 of the bonding layer 40 is filled in the gap between the driver carrier 21 and the LED array 31 to support the driver carrier 21 and the LED array 31. Therefore, the growth substrate originally used to form the LED array 31 can be removed after the formation of the bonding layer 40 (including the formation of the connecting metal 42). After removal of the growth substrate, wavelength conversion elements 45, such as QD phosphors, may be formed on the surface of the first semiconductor layer 311 opposite to the light-emitting units (LU) to achieve the full color. Taking the LU emitting blue light as an example, a portion of blue light can be converted into red light and green light for achieving the full color by wavelength conversion components 45.

In addition, in production, the LED array 31 can be cut from a wafer containing a plurality of light-emitting units (LU). For example, when an LED array with 1K*1K light-emitting units (LU) is fabricated, it is necessary to form 1000 light-emitting units (LU) in each of two directions of the LED array 31 on a wafer; after cutting the LED array 31 from the wafer, the LED array 31 is bonded to a driver carrier 21 (e.g., a CMOS substrate), as shown FIG. 2. Certainly, it is not limited thereto. In another embodiment, an LED wafer, which is a wafer having light-emitting units (LU) formed thereon, may be bonded with the driver carrier 21 firstly, and then, the wafer is cut to from the structure shown in FIG. 2. In FIG. 1, the alignment marks 318, such as crosses, are formed at the four corners of the LED array 31 for the driver carrier 21 to align with the LED array 31 during bonding process. In the embodiment, the alignment marks 318 can be, but not limited to, formed near the end of the conductive pad 316P.

Figure 3A:
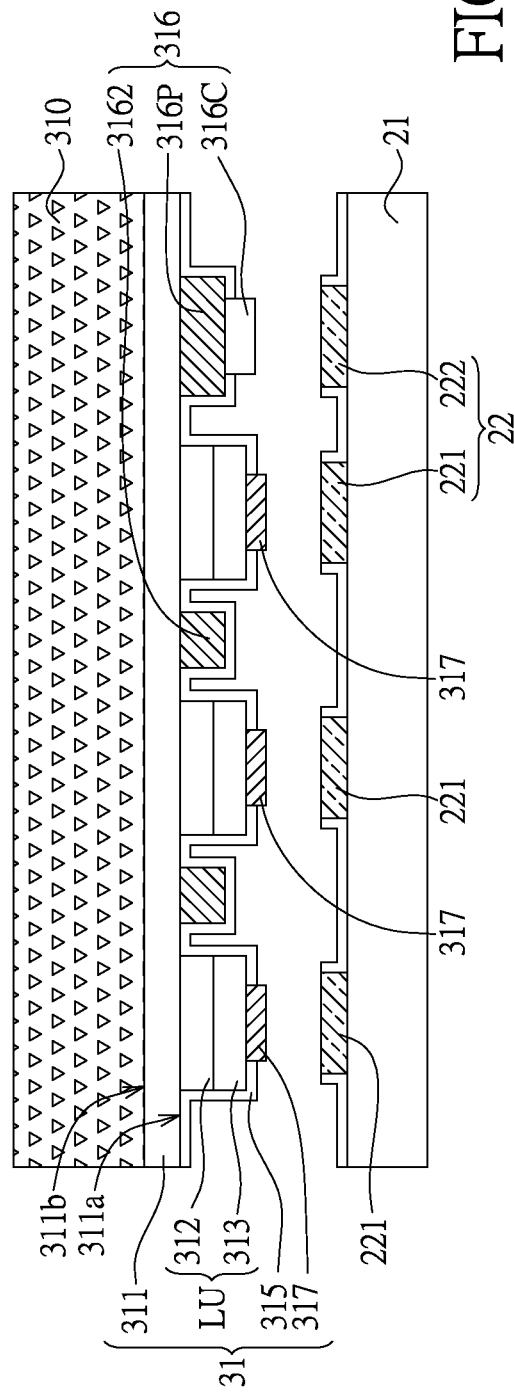

FIGS. 3A-3E show a method of fabricating a display in accordance with an embodiment of the present application. The same elements in FIGS. 3A-3E and FIG. 2 are denoted by the same reference numerals for clarity of explanation. As shown in FIG. 3A, a driver carrier 21 (e.g., a CMOS backplane) and a light emitting assembly 3 (e.g., LED wafer) are provided, and the light emitting assembly 3 includes a growth substrate 310 and the LED array 31, which, as abovementioned, includes a first semiconductor layer 311, a plurality of light-emitting units (LU), the insulating layer 315, the plurality of first electrodes 316, and the plurality of second electrodes 317. For details of the element arrangement of the driver carrier 21 and the LED array 31, please refer to the abovementioned description, and the details thereof are not described herein. In one embodiment, the growth substrate 310 can be a patterned sapphire substrate, and the first semiconductor layer 311 and the plurality of light-emitting units (LU) including gallium nitride (GaN) can be epitaxially grown on the growth substrate 310 by metal organic chemical-vapor deposition (MOCVD).

Thereafter, as shown in FIG. 3B, a bonding layer 40, including a bonding glue 41 and a plurality of connecting metals 42, is formed between the driver carrier 21 and the LED array 31. Each of the connecting metals 42 includes a first portion 421 corresponding to the light-emitting unit (LU) and a second portion 422 corresponding to the first electrode 316, such as the conductive pad 316P. The detail of the connecting metal 42 is recited in the above description, and the details thereof are not described herein.

After the driver carrier 21 and the light emitting assembly 3 (e.g., LED wafer) including the LED array 31 are bonded, the bonding glue 41 fills the gap between the driver carrier 21 and the light emitting assembly 3 for supporting the driver carrier 21 and the LED array 31. Next, as shown in FIG. 3C, the growth substrate 310 can be removed. In one embodiment, the growth substrate 310 can be removed by laser lift-off method.

Figure 3D:
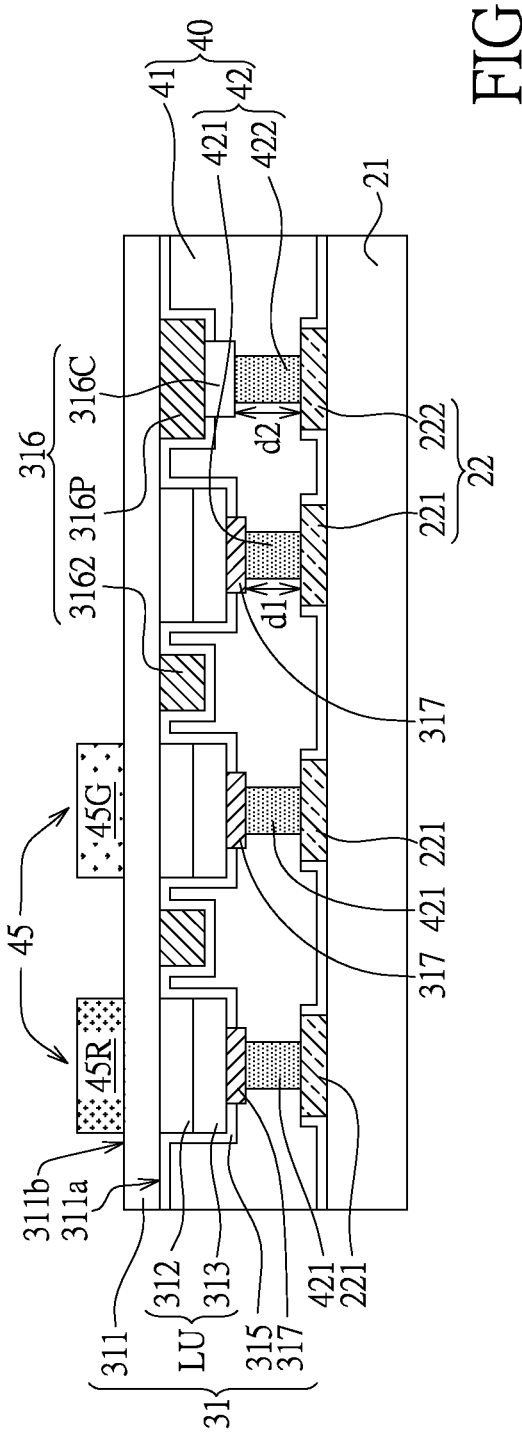

Then, as shown in FIG. 3D, because the bonding glue 41 supports the LED array 31, a wavelength conversion element 45, such as quantum dots (QD, a fluorescent luminescent crystal), can be formed on the surface of the first semiconductor layer 311 opposite to the surface on which the different light-emitting units LU are located. In one embodiment, when the QD is excited by blue light with short-wavelength (high-energy), the photons with long-wavelength (low-energy) are emitted, and the emitted photons have narrow wavelength distribution and controllable peak wavelength. By controlling the QD process, the size and the size distribution of QD can be adjusted to control the peak wavelength for converting to different light and achieve a narrow wavelength distribution. In one embodiment, the wavelength conversion element 45 includes a plurality of red wavelength conversion elements 45R and a plurality of green wavelength conversion elements 45G. To be more specific, one of the red wavelength conversion elements 45R (emitting red light with a peak wavelength between 580 nm and 700 nm) is disposed on one of the light-emitting units (LU), one of the green wavelength conversion elements 45G (emitting green light with a peak wavelength between 530 nm and 570 nm) is disposed on one of the light-emitting units (LU), and one light-emitting unit (LU), which emits blue light with a peak wavelength between 450 nm and 490 nm for example, does not have the wavelength conversion element disposed thereon together form a RGB pixel. Multiple RGB pixels are formed to achieve a full color display. In one embodiment, the first semiconductor layer 311 has a first surface 311a and a second surface 311b opposite to the first surface 311a (namely, upper and lower surfaces), wherein the first surface 311a faces the driver carrier 21, and the light-emitting units (LU) are formed on the first surface 311a. The wavelength conversion elements 45 (e.g., the red wavelength conversion element 45R and the green wavelength conversion element 45G) are formed on the second surface 311b and respectively corresponding to a portion of the light-emitting units (LU), wherein the wavelength conversion elements 45 are spaced apart from each other. In accordance with the embodiment, because the structure of the display does not have the growth substrate, mutual cross-talk of the optical signals between the pixels can be avoided, and the overall thickness of the display can also be reduced for increasing the flexibility of the display.

Figure 3E:
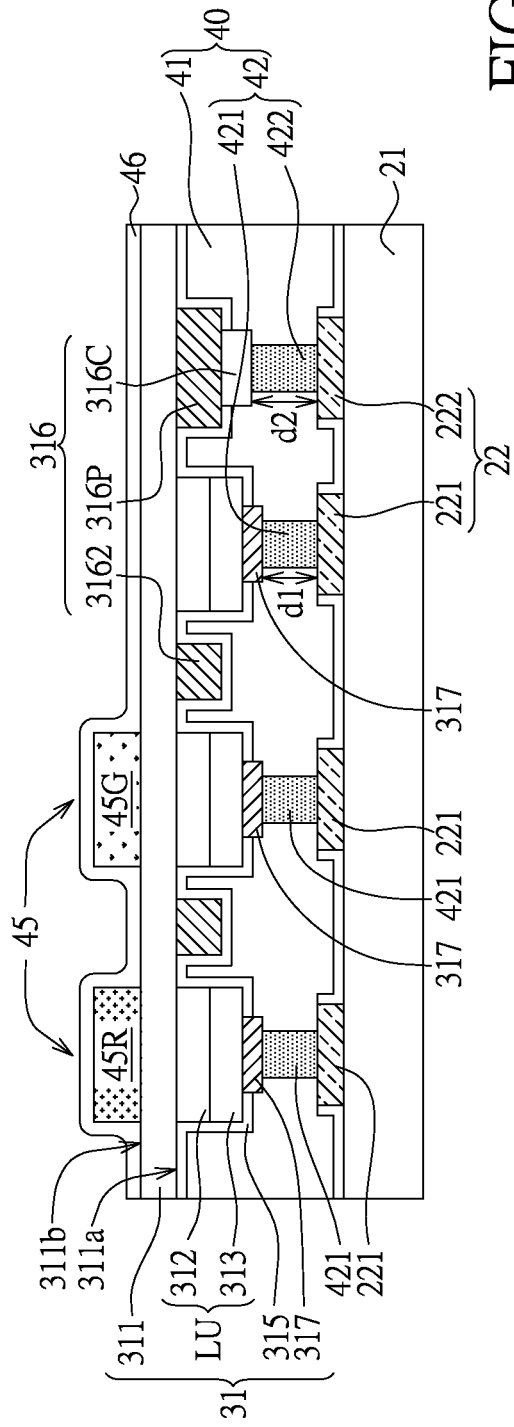

Next, as shown in FIG. 3E, a waterproof layer 46 is formed on the second surface 311b of the first semiconductor layer 311 and covers the wavelength conversion elements 45 (45R/45G). In one embodiment, the wavelength conversion element 45 can be a quantum dot (QD) phosphor material layer, and the waterproof layer 46 is a transparent waterproof film and made of epoxy or other material which can block moisture and has highly transmittance (for example, a transmittance coefficient of the waterproof layer 46 with respect to the light emitted by the light-emitting unit (LU) is greater than 90%) to protect a quantum dot phosphor material that is susceptible to moisture. Further, in the abovementioned step shown in FIG. 3D, the wavelength conversion element 45 can be formed by photolithography process.

Figure 4A:
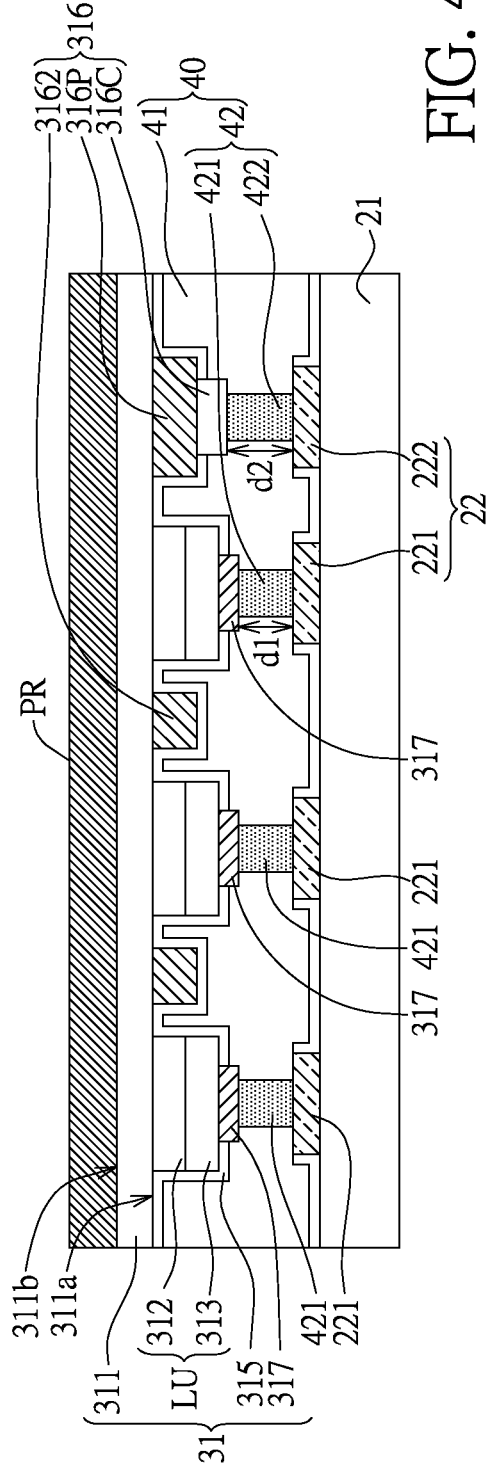
FIGS. 4A-4C show a method of manufacturing a wavelength conversion element in accordance with one embodiment of present application.
Figure 4B:
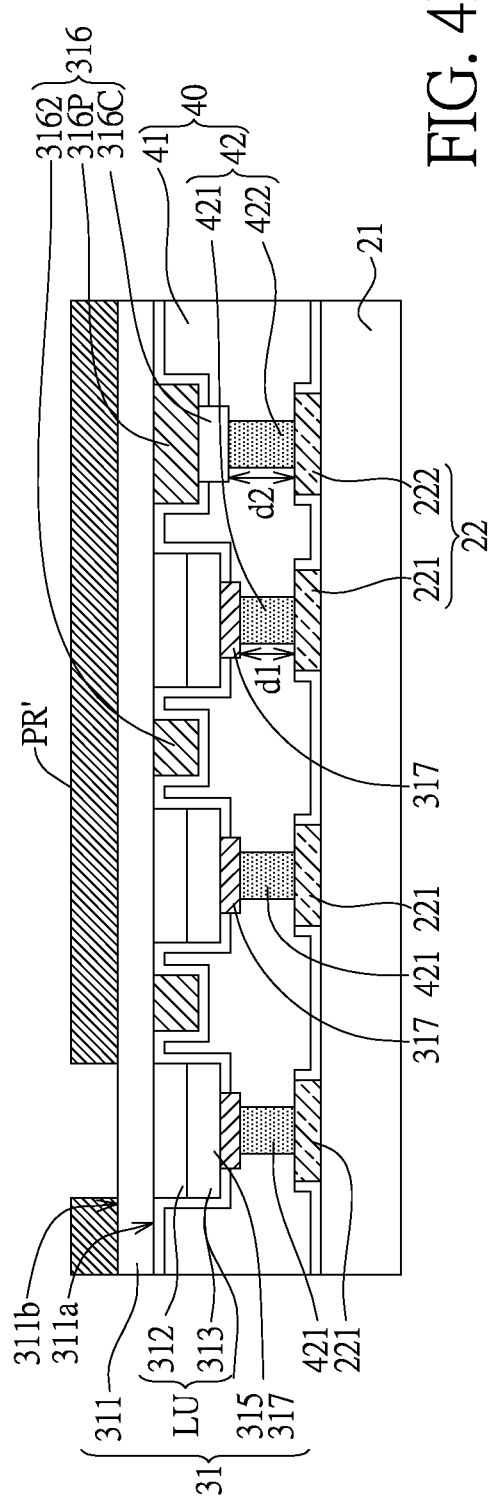
Figure 4C:
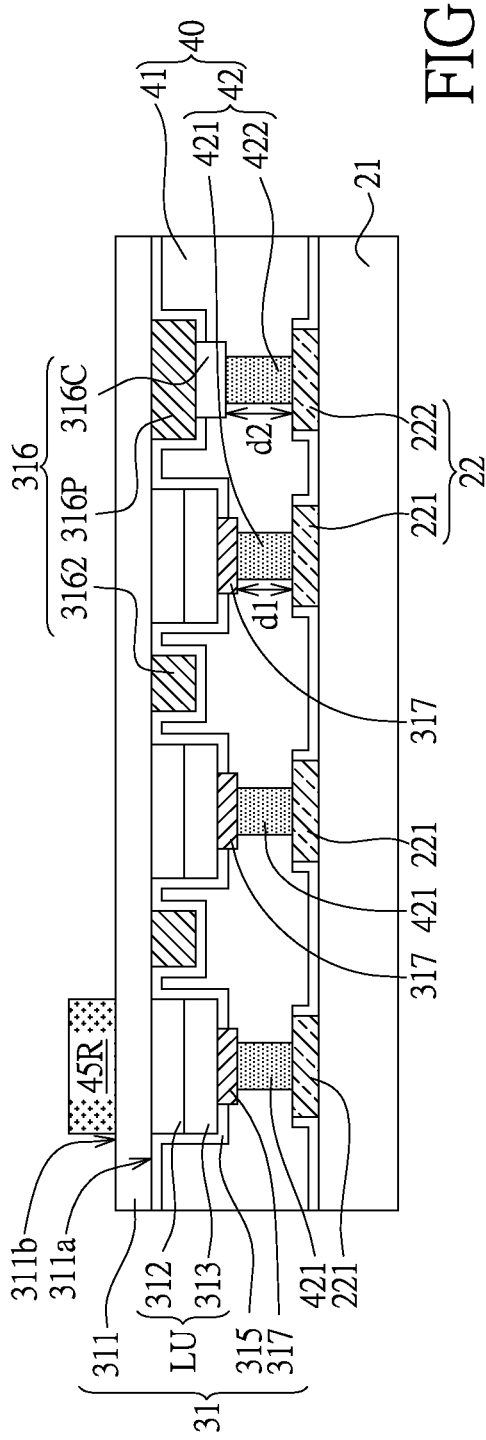

FIGS. 4A-4C illustrate a method for manufacturing a wavelength conversion element 45 in accordance with one embodiment of the present application. As shown in FIG.

4A, a photoresist PR is formed on the first semiconductor layer 311. Then, as shown in FIG. 4B, a patterned photoresist PR' is formed by photolithography process, wherein the patterned photoresist PR' includes an opening corresponding to the position where the red wavelength conversion element 45R is subsequently formed. Then, as shown in FIG. 4C, the red wavelength conversion element 45R is formed and the patterned photoresist PR' is removed. Similarly, the green wavelength conversion element 45G can be formed with the same steps as shown in FIGS. 4A-4C to complete the fabrication of the wavelength conversion element 45 as shown in FIG. 3D.

In addition, the abovementioned embodiment is explained by the light-emitting unit (LU) made of a blue GaN layer, the red wavelength conversion element 45R and the green wavelength conversion element 45G (e.g., FIGS. 2, 3A-3E), but the disclosure is not limited to this aspect. In practical application, the wavelength conversion element 45 is appropriately disposed in accordance with the color of the light emitted by the light-emitting unit (LU). For example, in one embodiment, if the light-emitting unit (LU) emits ultraviolet (UV) light, a blue wavelength conversion element is required to convert the non-visible UV light into blue light.

Figure 5:
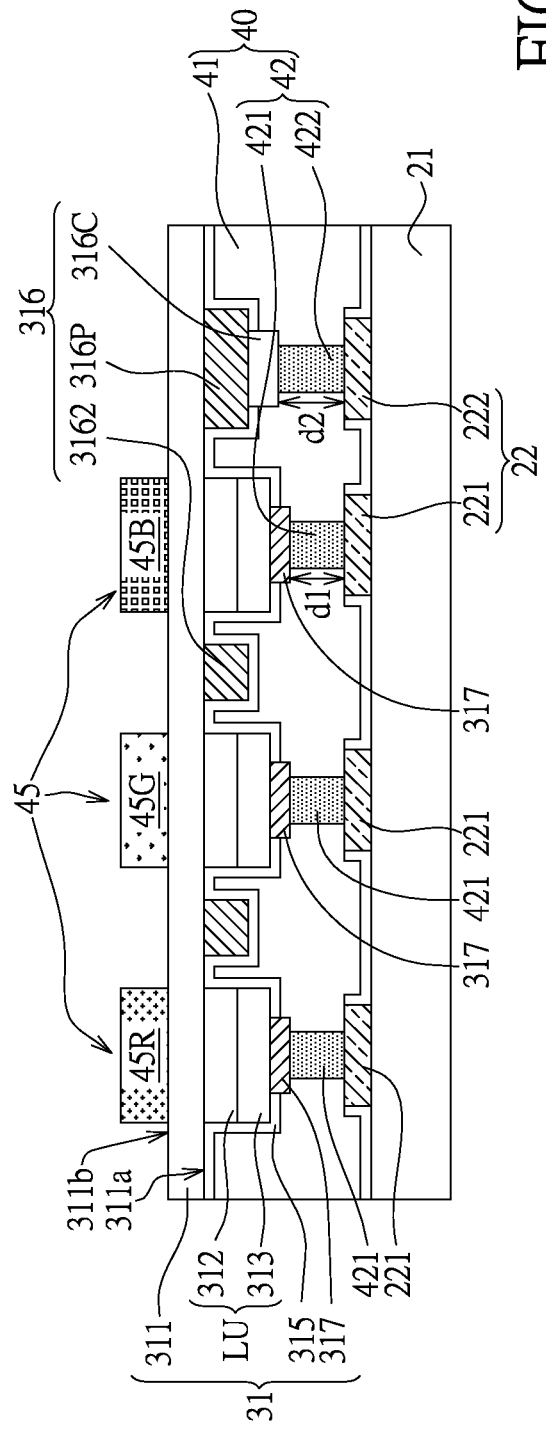
FIG. 5 shows a schematic cross-sectional view of a display in accordance with one embodiment of present application.

FIG. 5 shows a cross-sectional view of a display in accordance with another embodiment of the present application. The same components in FIG. 5 and FIG. 3D are denoted by the same reference numerals for clarity of explanation, the contents of the components are as described above, and the detailed description thereof will not be repeated here. In FIG. 5, a red wavelength conversion element 45R, a green wavelength conversion element 45G, and a blue wavelength conversion element 45B are formed on the first semiconductor layer 311 to form a RGB pixel, and accordingly multiple RGB pixels are formed to achieve a full color display.

Furthermore, in some embodiments, low transmittance material or non-transmittance material, such as an opaque material, may be formed to surround each wavelength conversion element 45. FIG. 6 shows a cross-sectional view of a display in accordance with another embodiment of the present application. The same components in FIG. 6 and FIG. 3D are denoted by the same reference numerals for clarity of explanation, and the contents of the components are as described above and the detailed description thereof will not be repeated here. In FIG. 6, opaque material OM is formed on the first semiconductor layer 311 to surround each of the wavelength conversion elements 45. For example, the opaque material OM surrounds the red wavelength conversion element 45R and the green wavelength conversion element 45G to reduce the mutual interference of light (cross-talk) emitted from the red wavelength conversion element 45R and the green wavelength conversion element 45G. The opaque material OM can be made of black, white or other non-transmittance material, such as black pigment and white pigment. The material of black pigment includes carbon black, and the material of the white pigment includes titanium oxide, silicon dioxide, aluminum oxide, magnesium oxide, zinc oxide, zinc sulfide or zirconia oxide.

Figure 7:
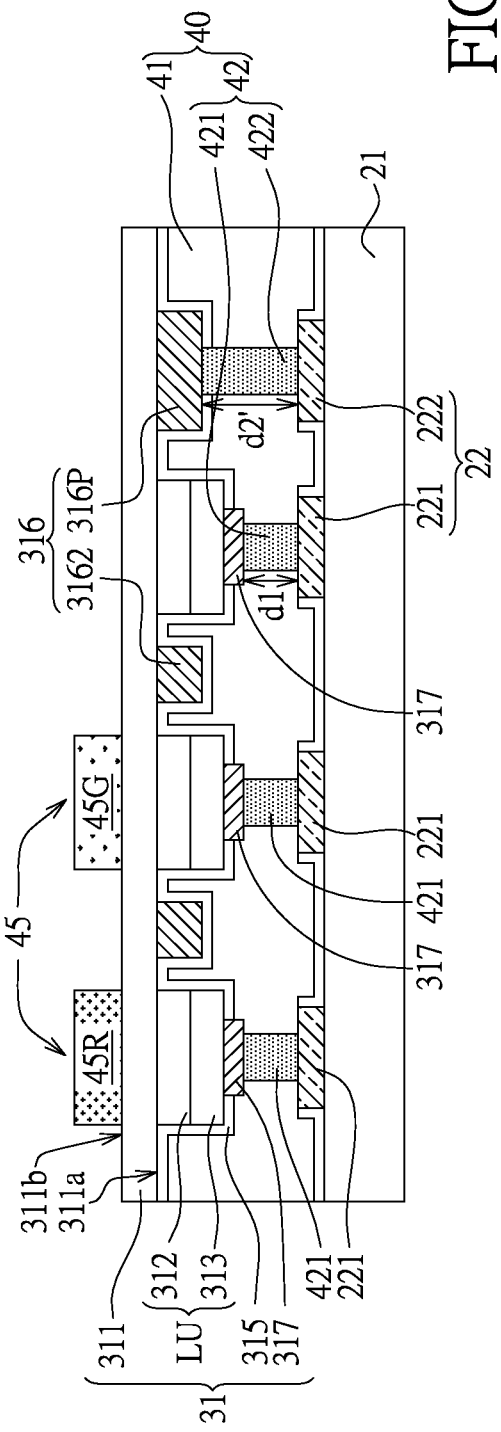
FIG. 7 shows a schematic cross-sectional view of a display in accordance with one embodiment of present application.

FIG. 7 shows a cross-sectional view of a display in accordance with another embodiment of the present application. The same or similar elements in FIG. 7 and FIG. 2 are denoted by the same or similar reference numerals for clarity of explanation. In this embodiment, the horizontal level of the first electrodes 316 (e.g., the conductive pad 316P) is different from the horizontal level of the second electrode 317 (e.g., the conductive pad 316P is closer to the first semiconductor layer 311 than the second electrode 317 is). In this embodiment, the connecting portion 316C is not formed under the first electrode 316, for example, above under the conductive pad 316P. Therefore, as shown in FIG. 7, the connecting metal 42 including the second portions 422 directly connects the conductive pads 316P and the second control pads 222 of the driver carrier 21. The height d2' of the second portion 422 in FIG. 7 is greater than the height d2 of the second portion 422 in FIG. 2. The arrangement of the first portions 421 and the second portions 422 of the connecting metals 42 and the relative horizontal levels of the first electrode 316 and the second electrode 317 are not limited to embodiments shown in the FIG. 2 and FIG. 7. The heights d1 and d2' of the connecting metal 42 are different or close to each other, and the horizontal levels of the first electrodes 316 and the second electrodes 317 are different or close to each other, which are applicable to the structures of the disclosed embodiments. However, the horizontal levels of the first electrode 316 and the second electrode 317 in the structure of this embodiment are different and the height d1 and height d2 of the connecting metals are different, the method disclosed in the embodiment can ensure the electrical conduction between the driver carrier 21 and the first electrodes 316 and the second electrodes 317 for the LED array 31 with the different heights d1 and d2.

Figure 8A:
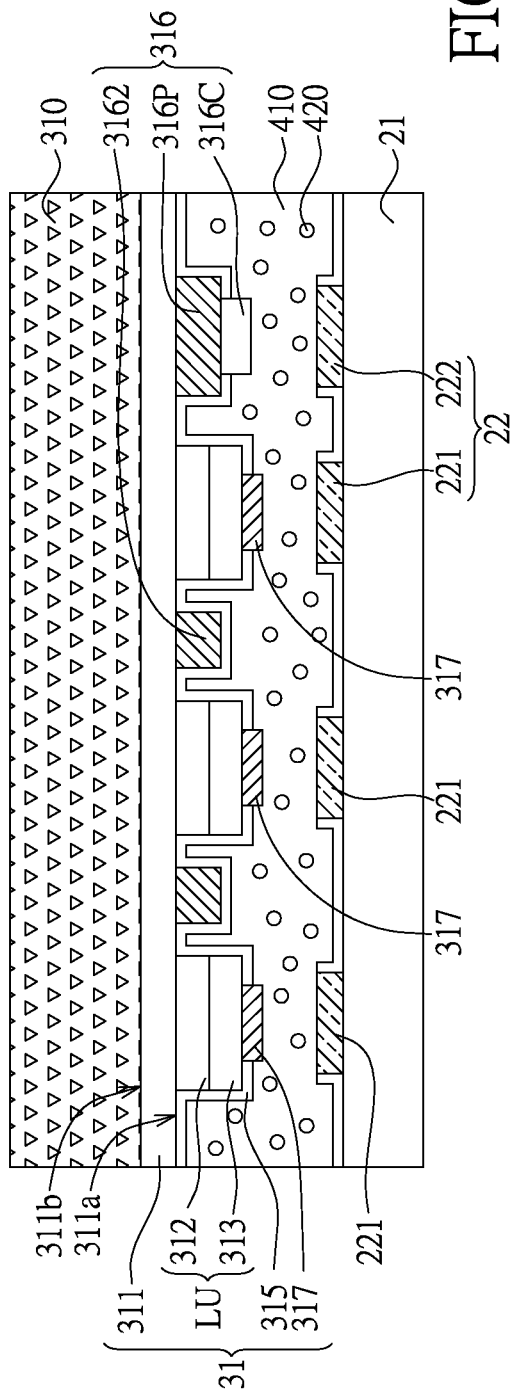
FIGS. 8A and 8B show a bonding process in accordance with one embodiment of present application.
Figure 8B:
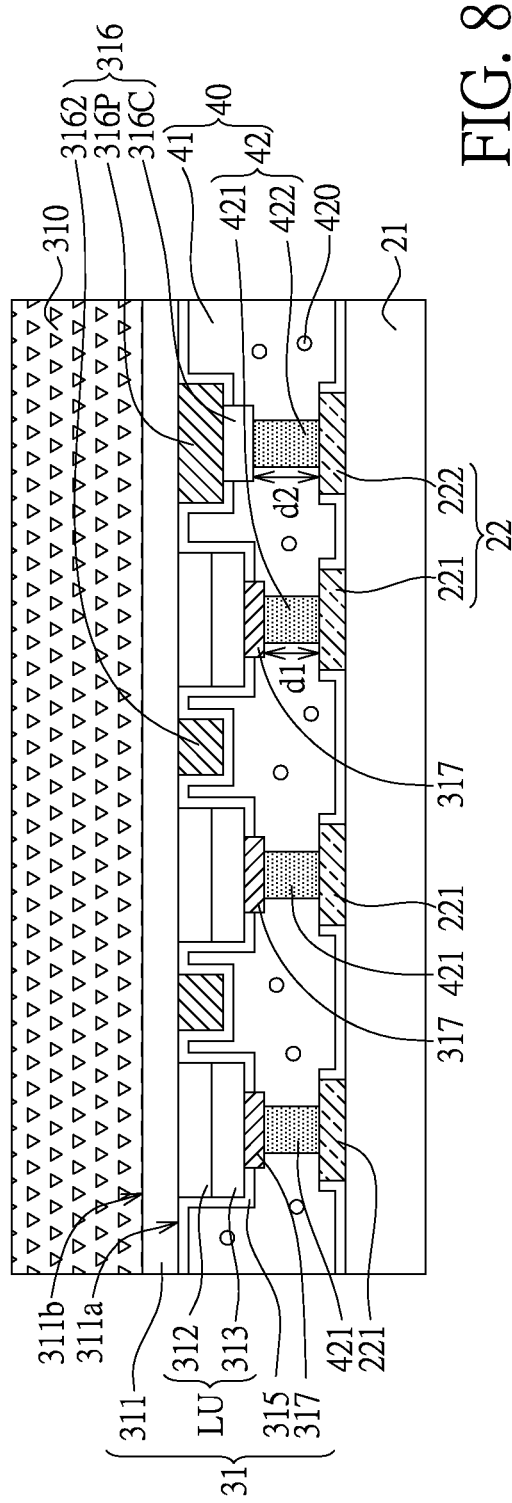

FIGS. 8A and 8B show a bonding process in accordance with an embodiment of the present application. FIG. 8A shows a state of bonding layer 40' before heating step of the bonding process, and FIG. 8B shows a state of the bonding layer 40 after heating step of the bonding process. In addition, the same elements in the drawings of FIGS. 8A and 8B and those of FIGS. 3A and 3B are denoted by the same reference numerals for clarity of explanation. In this embodiment, a self-assembly conductive paste is used in the bonding process.

As shown in FIG. 8A, the driver carrier 21 and a light emitting assembly 3 are filled with a self-aligned conductive paste between thereof, and the self-aligned conductive paste includes a non-conductive glue 410 and a plurality of conductive particles 420 before being heated. The conductive particles 420 are approximately uniformly dispersed in the non-conductive glue 410 as shown in FIG. 8A; namely, in the non-conductive glue 410, the distribution density of the conductive particles 420 corresponding to the first electrode 316 and the second electrode 317 is similar to the distribution density of the conductive particles 420 corresponding to the area other than the first electrode 316 and the second electrode 317. Then, the self-aligned conductive paste shown in FIG. 8A is heated in the bonding process. For example, the structure shown in FIG. 8A is heated in a low temperature range (e.g., a temperature between about 140° C. to 180° C.) for a short time (e.g., about 30 seconds to 3 minutes), and then, the conductive particles 420 are melted and electrically connected with the first electrode 316, the second electrode 317 and the control pads 221/222. As shown in FIG. 8B, a portion of the conductive particles 420 are gathered between the first electrode 316/the second electrode 317 and the control pads 221/222, and form the first portion 421 and the second portion 422 of the connecting metal 42 as mentioned in the above embodiment. The non-conductive glue 410 and the remaining of the conductive particles 420, which are not forming the connecting metal 42, form the bonding glue 41 of the bonding layer 40 as mentioned in the above embodiment. After the bonding process, the non-conductive glue 410 is also solidified due to the heating process.

The plurality of conductive particles 420 includes metal material having a melting point less than 300° C. The metal material may be an element, such as bismuth (Bi), tin (Sn), silver (Ag) and indium (In), a compound or an alloy and an alloy thereof (e.g., alloy of tin antimony silver). When the conductive particles 21 are alloys, the melting point of the conductive particles 21 refers to the eutectic point of the alloy. The non-conductive glue 410 may be a thermosetting polymer, such as epoxy, silicone, polymethyl methacrylate and episulfide. The non-conductive glue 410 can be cured at a curing temperature. In an embodiment, the melting point of the conductive particles 420 is lower than the curing temperature of the non-conductive glue 410. As shown in FIG. 8A, before the heating process, the grain size of the conductive particle 420 is defined as the diameter of the conductive particle 420, and the shortest distance between the two adjacent second electrodes 317 is preferably more than twice the grain size of the conductive particle 420. In one embodiment, the conductive particles 420 are solder balls, which has a grain size between 1 μm~50 μm (inclusive). However, the numerical values are only presented as examples and are not intended to limit the disclosure.

For the structural form of the first electrode 316 and the second electrode 317 having different horizontal levels (the heights of the connecting metals d1 and d2 are different), if an anisotropic conductive film (ACF) is pressed for respectively bonding the first/second electrodes 316/317 and the control pad 221/222 on the driver carrier 21, the first/second electrodes 316/317, which have different horizontal levels, may accept different forces during pressing ACF for resulting in conduction failure between the second electrode 317 and the driver carrier 21. Therefore, compared with the conventional method of plating the contacts (bumps) on the first electrode 316 and the second electrode 317 or using an anisotropic conductive film (ACF) bonding, the bonding method proposed in the embodiment using the abovementioned self-aligned conductive paste, which has the characteristics of the self-aligning group after heating without pressing, can ensure the electrical conduction between the driver carrier 21 and the first electrode 316, the second electrode 317 and prevents the different and uneven forces thereon caused by the difference of horizontal levels of the first electrode 316 and the second electrode 317 or the difference of the heights d1 and d2 of the connecting metals 421, 422. Moreover, since the self-aligned conductive paste has the characteristics of self-assembly after heating without the conventional problem that the contacts point are not easy to be aligned, the bonding process with the self-aligned conductive paste is easy and quick, and is suitable for mass production.

Figure 9:
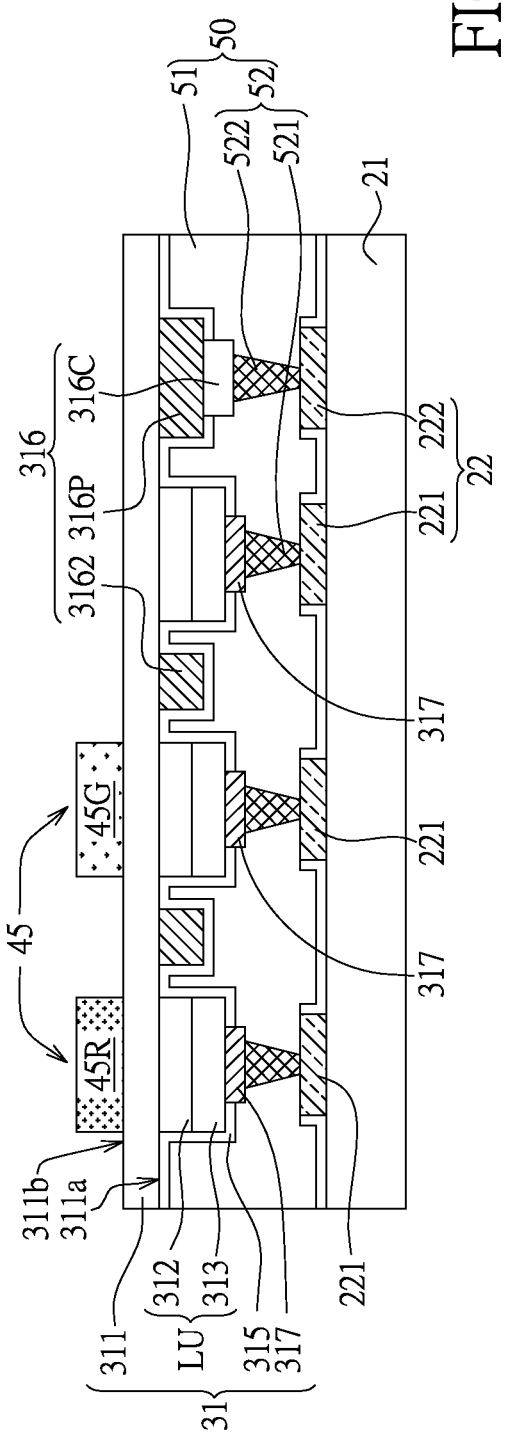
FIG. 9 shows a schematic cross-sectional view of a display in accordance with one embodiment of present application.

In addition to the self-aligned conductive paste as mentioned above, other materials and methods can be used to form the bonding layer 40 of the embodiment. FIG. 9 shows a cross-sectional view of a display in accordance with another embodiment of the present application. The same or similar reference numerals are used for the same or similar components, and the description of the same or similar components is as described above, which will not be described herein. As shown in FIG. 9, the bonding layer 50 may include a bonding glue 51 and a plurality of connecting metals 52. The connecting metals 52 include a plurality of first portions 521 and a plurality of second portions 522, wherein the first portions 521 are corresponding to the light-emitting units (LU) and the second portions 522 are corresponding to the conductive pads 316P. For details of the connecting and disposing method, please refer to the descriptions of the first portion 421 and the second portion 422 shown in FIG. 2. In the embodiment as shown in FIG. 2, the connecting metal 42 can be formed by melting and agglomerating the conductive particles 420 in a heating step. Further, in the embodiment as shown in FIG. 9, the connecting metal 52 can be formed of a metal body or other electric conductor by photolithography process. The connecting metal 52 of the bonding layer 50 can be metal, such as indium and tin, or other electrical conductor, and the bonding glue 51 of the bonding layer 50 can be polymer with high transmittance, such as Benzocyclobutene polymer (BCB-based polymer) and resin. The BCB-based polymer is a thermosetting polymer with low dielectric property and has excellent bonding ability, chemical resistance and good bonding strength. The material of the resin includes thermosetting polymer and flux, wherein the thermosetting polymer can be epoxy resin. Other material with high transmittance (e.g., the transmittance for the light emitted from the light-emitting unit is more than 90%) and adhesive property can also be applied, not limited to BCB-based polymer or resin.

Figure 10A:
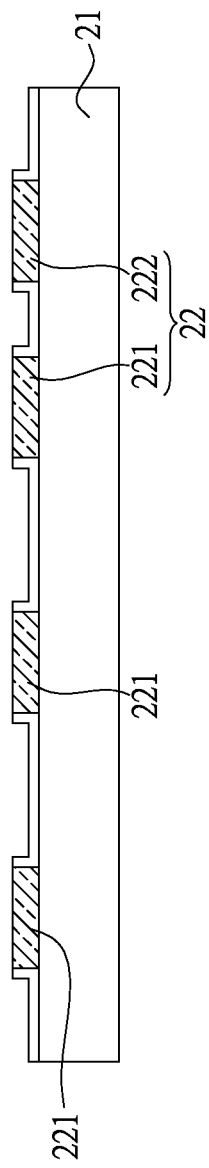
Figure 10B:
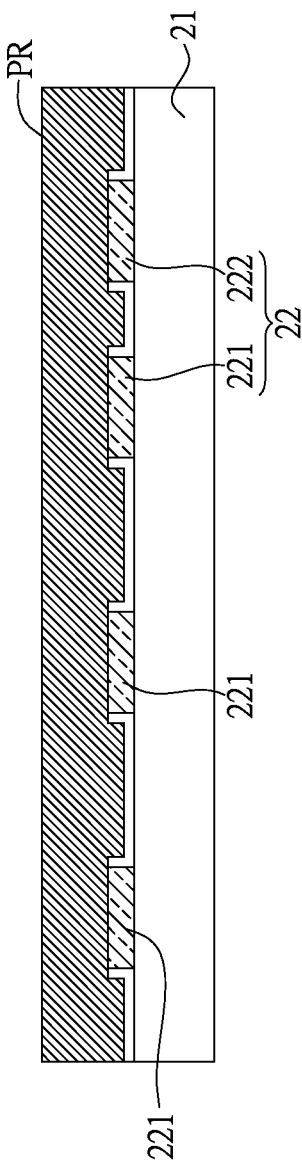
Figure 10E:
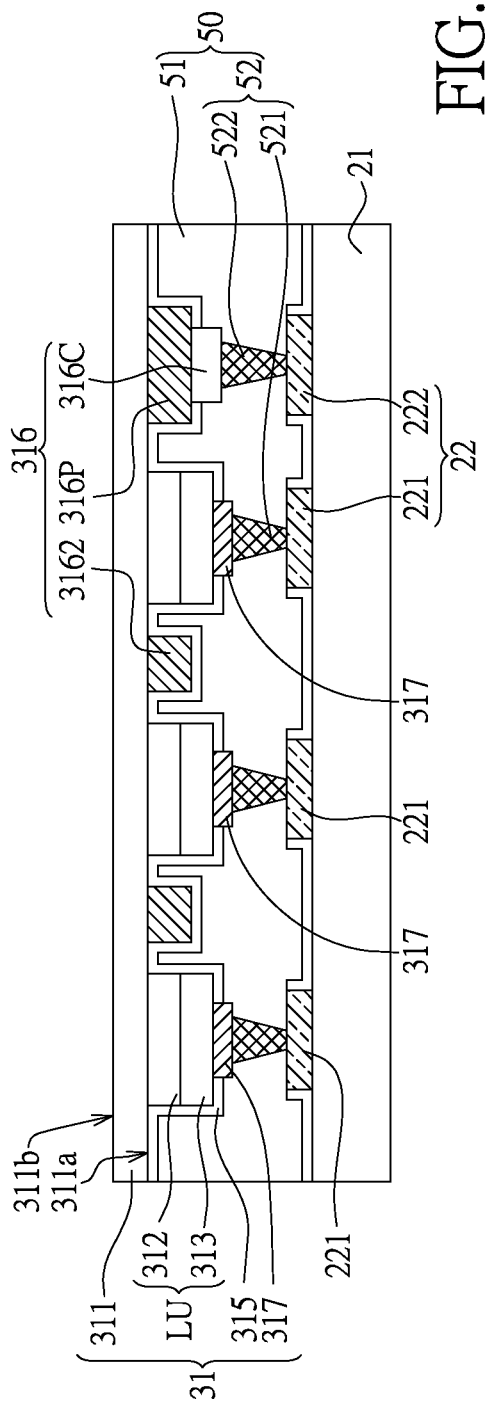
Figure 10F:
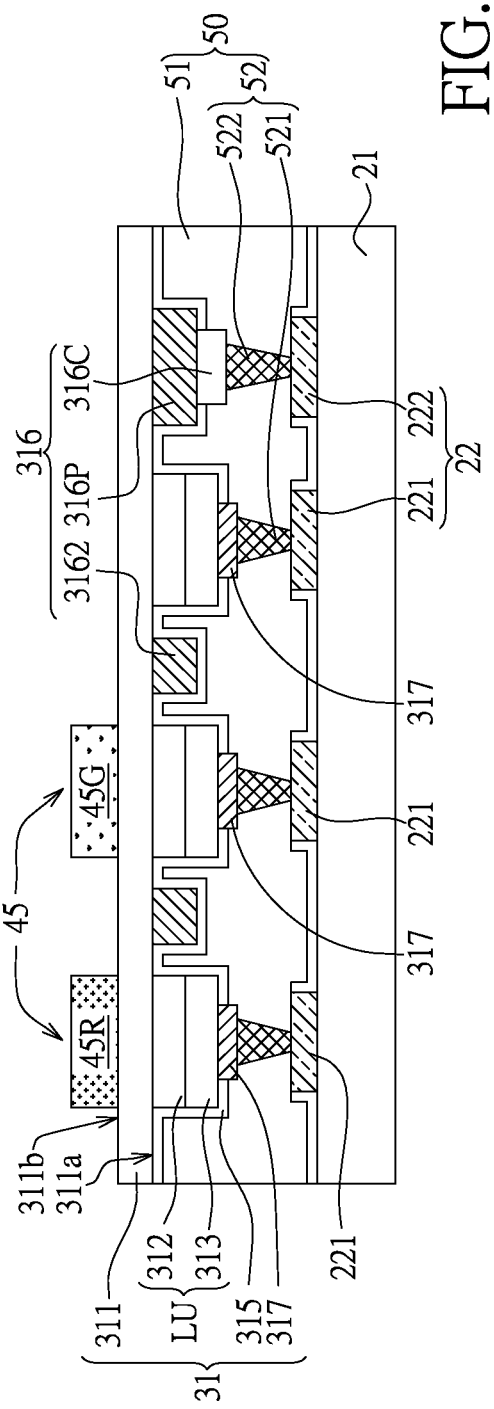

FIGS. 10A-10F shows one of the methods of manufacturing the display as shown in FIG. 9. The same elements in FIGS. 10A-10F and FIGS. 3A-3E are denoted by the same reference numerals, and the contents of the related elements can refer to the aforementioned relevant paragraphs. As shown in FIG. 10A, a driver carrier 21 (having a control circuit, such as a CMOS backplane) is provided and has a plurality of pads 22 (e.g., a first control pad 221 and a second control pad 222). Next, a photoresist PR is formed over the driver carrier 21 as shown in FIG. 10B. The photoresist PR is treated by photolithography process to form a patterned photoresist PR', and a plurality of openings are formed for the connecting metals 52 to be formed in the following step as shown in FIG. 10C. Thereafter, a metal layer (such as indium, tin, copper, gold, aluminum, silver) or other electrically conductive layer is formed on the opening by vapor deposition to form the first portions 521 and the second portions 522 of the connecting metals 52. And then, the patterned photoresist PR' is removed as shown in FIG. 10D. Next, the structure shown in FIG. 10D and the LED array 31 are aligned and connected, and then the bonding glue 51 is filled within the space between the driver carrier 21 and the LED array 31 as shown in FIG. 10E. Then, wavelength conversion elements 45 (e.g., 45R/45G or 45R/45G/45B, depending on the color of the light from LU) are formed as shown in FIG. 10F.

Figure 11A:
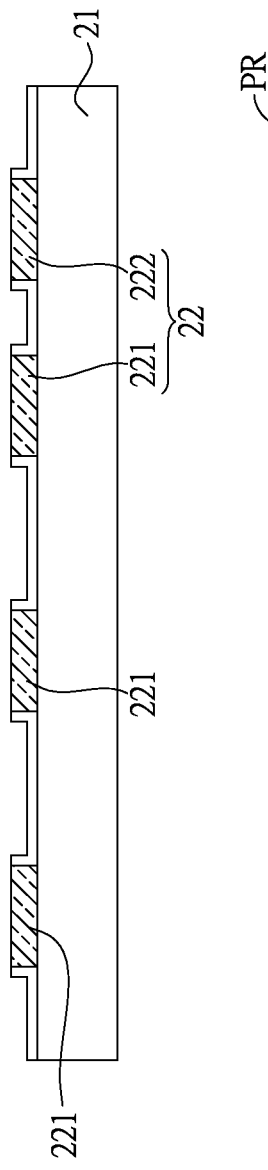
FIGS. 11A-11G show another method of manufacturing the display as shown in FIG. 9.
Figure 11B:
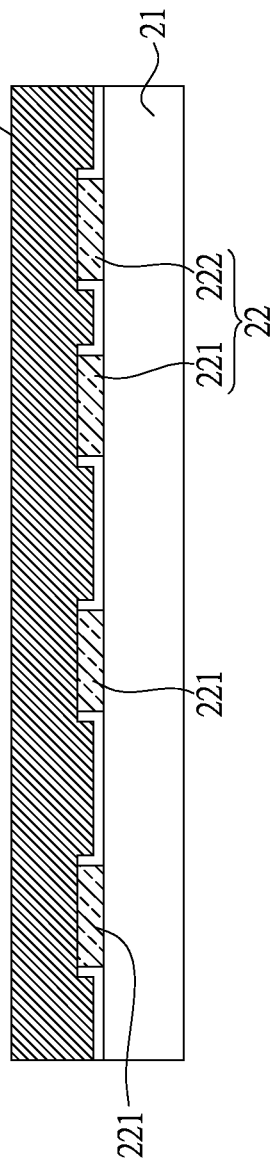
Figure 11C:
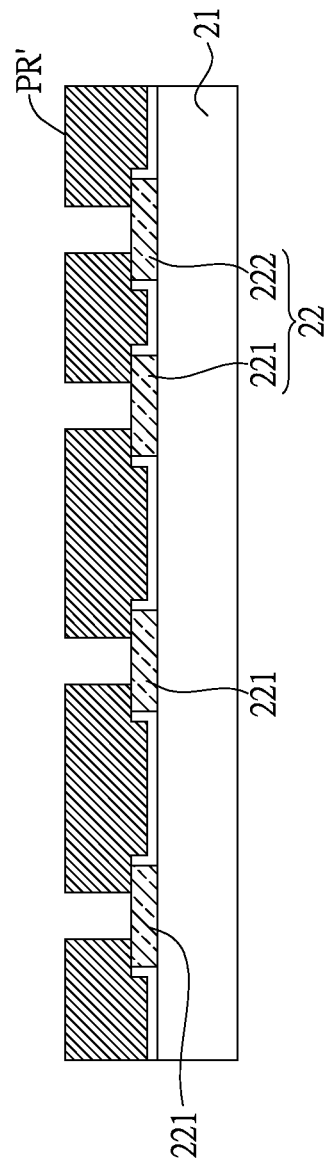
Figure 11D:
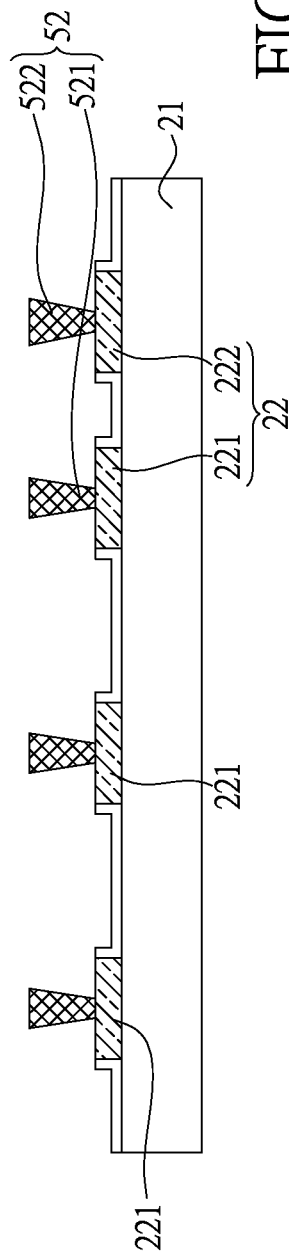
Figure 11E:
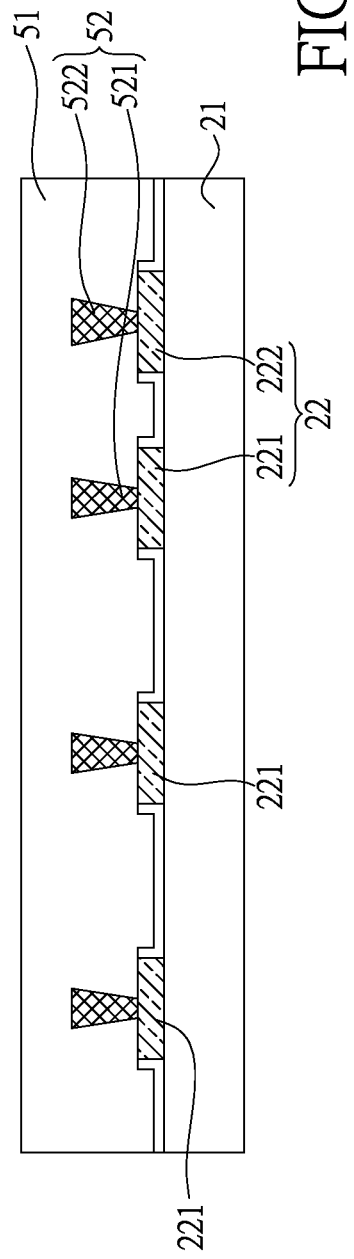
Figure 11F:
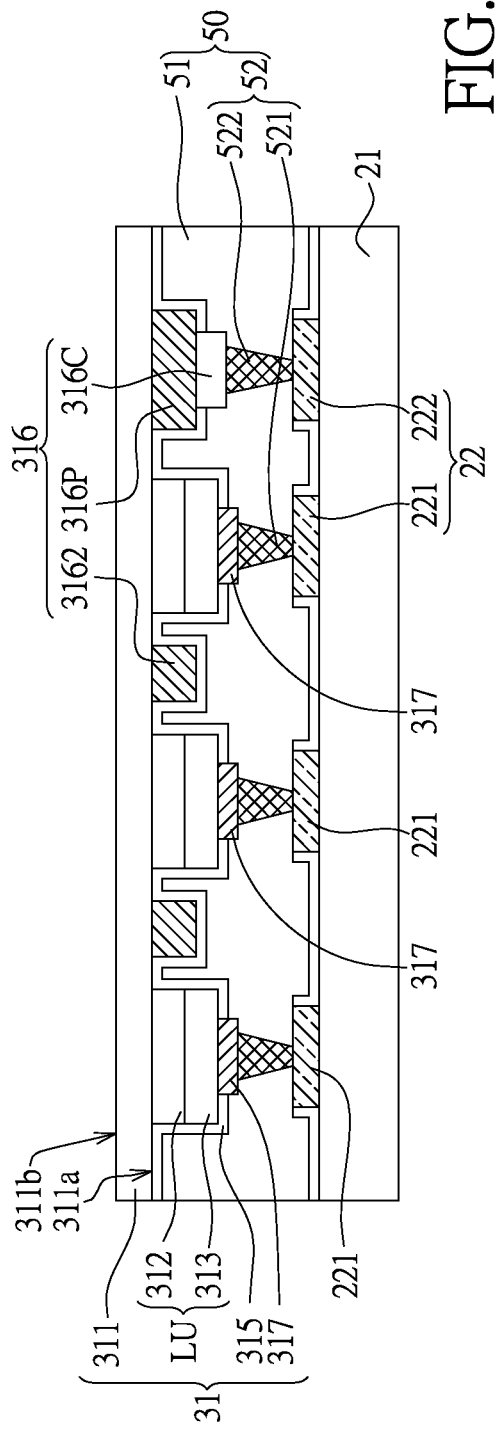
Figure 11G:
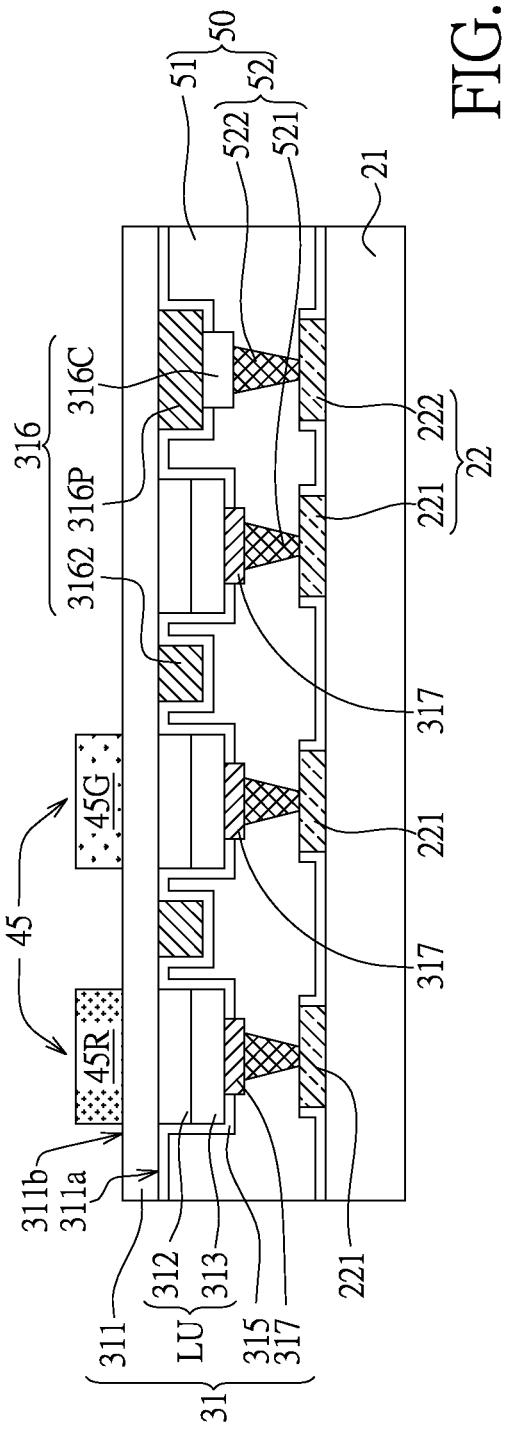

FIGS. 11A-11G show another method of manufacturing the display as shown in FIG. 9. The same elements in the drawings of the 11A-11G and the 3A-3E are denoted by the same reference numerals, and the contents of the related elements can refer to the aforementioned relevant paragraphs. As shown in FIG. 11A, a driver carrier 21 (having a control circuit, such as a CMOS backplane) is provided and has a plurality of pads 22 (e.g., first control pads 221 and second control pads 222) on thereof. Next, a photoresist PR is formed over the driver carrier 21 as shown in FIG. 11B. The photoresist PR is treated by photolithography process to form a patterned photoresist PR', and a plurality of openings are formed for the first portions 521 and the second portions 522 of the connecting metals 52 to be formed thereon in the following step as shown in FIG. 11C. Thereafter, a metal layer (such as indium, tin, copper, gold, aluminum, silver) or other electrically conductive layer is formed through the opening by vapor deposition to form the first portion 521 and the second portion 522. And then, the patterned photoresist PR' is removed as shown in FIG. 11D. Next, the unsolidified bonding glue 51 is formed on the driver carrier 21 to cover the connecting metals 52 as shown in FIG. 11E. And, the structure shown in FIG. 11E and the LED array 31 are aligned and connected to each other as shown in FIG. 11F. As FIG. 11F shows, in this step, the first portions 521 and the second portions 522 are melted, and thus, the first portions 521 and the second portion 522 are able to respectively jointed with the second electrodes 317 and the connecting portions 316C, and the bonding glue 51 is cured after the first portions 521 and the second portions 522 respectively joined to the second electrodes 317 and the connecting portions 316C.

In accordance with the above embodiments, the connecting metal 42/52 may be formed firstly, and then the bonding glue 41/51 is treated by a suitable process (e.g., heating or irradiation) based on the characteristics of the selected material of bonding glue to be cured for forming the bonding layer 40/50. The present application is not particularly to limit the material and forming method of the bonding layer in the embodiment. For example, the formation of the bonding glue 41/51 is not limited to before or after the driver carrier 21 (having a control circuit) connecting with the LED array 31.

As shown in FIGS. 2-9, the side walls of the connecting metal 42/52 are drawn in a straight line for illustration, but the side walls of the cross-sectional shape of the connecting metal 42/52 in practical application are not limited to the straight line depicted in FIGS. 2-9. The side walls (or outermost surfaces) of the connecting metals 42/52 may have a curved shape or an irregular shape, depending on the material selection and/or processing steps of the bonding layer. For example, when the self-aligned conductive paste is used as the bonding layer, the conductive particles 420 are heated, melted, and gathered at the electrodes to form the connecting metal 42 which has side wall with a curved shape, or the cross-sectional shape of the connecting metal 42/52 may be changed when the bonding glue 41/51 is cured. Therefore, the illustrations of the embodiments are for illustrative purposes only and are not intended to limit the disclosure.

In addition, in the abovementioned embodiments, the grid shaped n-electrodes as shown in FIG. 1 are taken as an example for the description of the embodiments, but the disclosure is not limited thereto. Non-grid shaped n-electrodes may also be applied to the embodiments of the present application. Another embodiment of a non-grid shaped n-electrode pattern is disclosed below.

Figure 12:
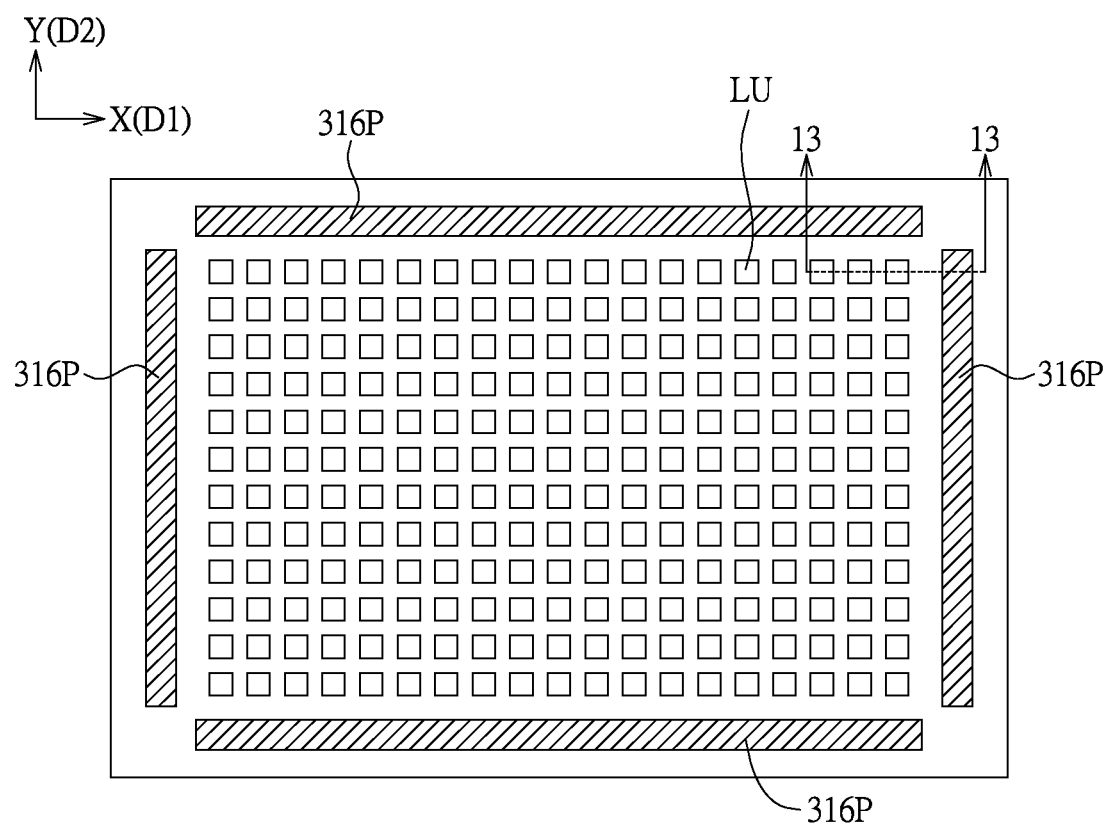
FIG. 12 shows a top view of an LED array and electrodes in accordance with one embodiment of present application.
Figure 13:
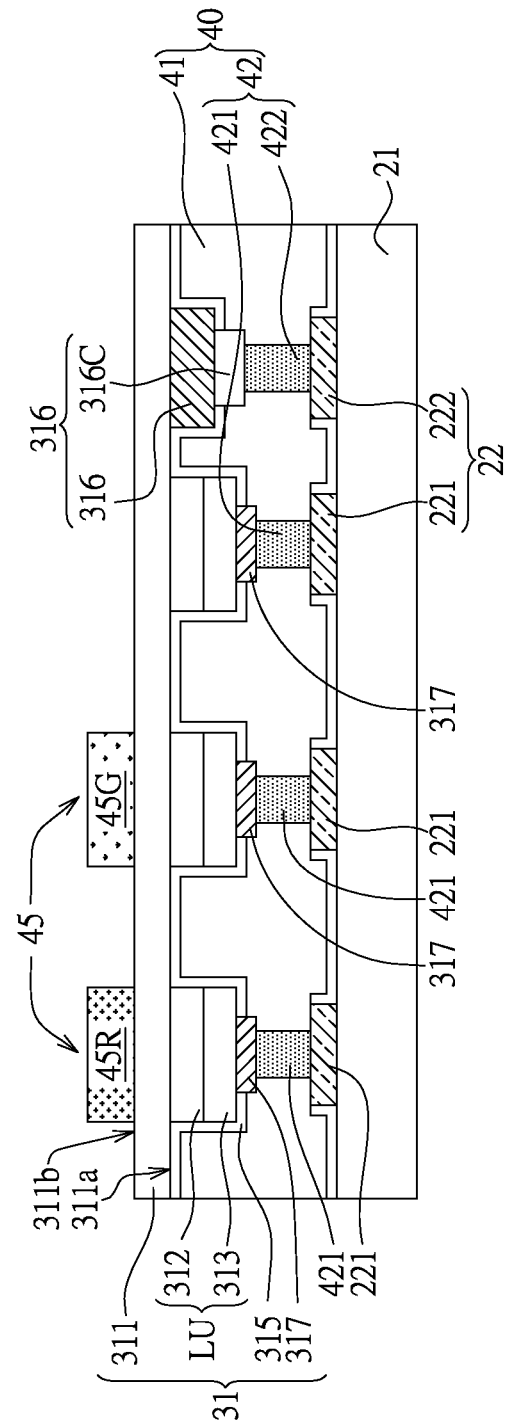
FIG. 13 shows a cross-sectional view of a display in accordance with one embodiment of present application, wherein the LED array and the electrodes are depicted along sectional line 13-13 of FIG. 12.

FIG. 12 shows a top view of an LED array and an electrode in accordance with another embodiment of the present application. FIG. 13 shows a cross-sectional view of a display in accordance with one embodiment of the present application, wherein the LED array and the electrode are depicted along cross-section line 13-13 of FIG. 12. The same or similar reference numerals are used for the same or similar components in FIGS. 12~13 and FIGS. 1~2, and the description of the same components is as described above and will not be described herein. The first electrode 316 as shown in FIG. 12 includes a conductive pad 316P located at the periphery of the LED array 31, which is different from the grid shaped first electrode of FIG. 1. The plurality of first and second metal traces 3161, 3162 extending in the first direction D1 and the second direction D2 (e.g., the X, Y directions) shown in FIG. 1 are not provided in the display shown in FIG. 12. Therefore, in the LED array 31 as shown in FIG. 13, there are no metal traces located between the two adjacent light-emitting units LU. This disclosure does not limit the applicable first electrodes 316 aspect.

The structures and steps of the abovementioned embodiments are used to describe some embodiments or application examples of the disclosure, and the disclosure is not limited to the scope and application of the above structures and steps. Other embodiments of different structural aspects, such as known components of different internal components, may be applicable, and the structures and steps of the examples may be adjusted depending on the actual application requirements or material selection. Therefore, the structures shown in the drawings are for illustrative purposes only and are not for limiting. It is generally known to the skilled in the art that the relevant structures and steps of the present application, such as the arrangement of the components and layers of the LED array, the electrodes, the control substrate or the manufacturing steps, may be adjusted and changed in accordance with practical applications Although the present application has been explained above, it is not the limitation of the range, the sequence in practice, the material in practice, or the method in practice. Any modification or decoration for present application is not detached from the spirit and the range of such.

What is claimed is:

1. A display, comprising:
   a carrier comprising a plurality of pads;
   an LED array located on the carrier and comprising:
   a first semiconductor layer;
   a plurality of active layers formed under the first semiconductor layer and spaced apart from each other;
   a plurality of second semi conductor layers respectively formed under each of the plurality of active layers;
   a plurality of first electrodes formed under the first semiconductor layer and electrically connected to the first semiconductor layers;
   a plurality of second electrodes respectively formed under and electrically connected to each of the plurality of second semiconductor layers;
   a bonding layer formed between the carrier and the LED array; and
   a plurality of wavelength conversion elements, separated from each other, and arranged on the LED array in a plurality of first positions corresponding to the plurality of active layers; and
   an opaque layer arranged on the LED array to separate the plurality of wavelength conversion elements from each other.

2. The display according to claim 1, wherein the plurality of wavelength conversion elements is arranged on the LED array without an interposition of growth substrate.

3. The display according to claim 1, wherein the plurality of first electrodes comprises a plurality of conductive pads located at a periphery of the LED array.

4. The display according to claim 3, wherein the plurality of first electrodes comprises a plurality of metal traces located between two adjacent active layers among the plurality of active layers.

5. The display according to claim 4, wherein the plurality of metal traces comprises a first metal trace and a second metal trace which are extended in different directions.

6. The display according to claim 4, wherein the plurality of conductive pads surrounds the plurality of metal traces.

7. The display according to claim 4, wherein the plurality of metal traces is covered by an insulating layer which is arranged between the bonding layer and the LED array.

8. The display according to claim 1, wherein the bonding layer comprises a glue and a plurality of connecting metals surrounded by the glue.

9. The display according to claim 8, wherein the plurality of connecting metals comprises a first portion connected to the plurality of second electrodes, and a second portion connected to the plurality of the first electrodes, the second portion is located at a periphery of the first portion.

10. The display according to claim 8, wherein the glue is filled in a space between the plurality of connecting metals, the carrier, and the LED array.

11. The display according to claim 8, wherein the glue is filled in a space between two adjacent connecting metals among the plurality of connecting metals.

12. The display according to claim 1, wherein the plurality of wavelength conversion elements is configured to be excited to emit different color.

13. The display according to claim 1, wherein the plurality of wavelength conversion elements comprises quantum dots.

14. The display according to claim 1, wherein the plurality of wavelength conversion elements comprises a red wavelength conversion element and a green wavelength conversion element.

15. The display according to claim 1, wherein the LED array is configured to emit a blue light or a UV light.

16. The display according to claim 1, wherein the carrier comprises a CMOS backplane.

17. The display according to claim 1, wherein the opaque layer has a first top surface, the plurality of wavelength conversion elements has a second top surface which is coplanar with the first top surface.

* * * * *